(12) United States Patent
Perry et al.

(10) Patent No.: US 12,381,486 B2
(45) Date of Patent: Aug. 5, 2025

(54) DELTA-BASED CURRENT STEERING FOR POWER CONVERTER PEAK/VALLEY CURRENT CONTROL

(71) Applicant: Cirrus Logic International Semiconductor Ltd., Edinburgh (GB)

(72) Inventors: Ivan Perry, Penicuik (GB); Hasnain Akram, Austin, TX (US); Graeme G. Mackay, Austin, TX (US); Pietro Gallina, Chandler, AZ (US); Chanchal Gupta, Chandler, AZ (US); Bryan Quinones, Sumner, WA (US); Abhishek Ray, Chandler, AZ (US)

(73) Assignee: Cirrus Logic Inc., Austin, TX (US)

( * ) Notice: Subject to any disclaimer, the term of this patent is extended or adjusted under 35 U.S.C. 154(b) by 81 days.

(21) Appl. No.: 17/990,098

(22) Filed: Nov. 18, 2022

(65) Prior Publication Data

US 2023/0188156 A1 Jun. 15, 2023

Related U.S. Application Data

(60) Provisional application No. 63/289,870, filed on Dec. 15, 2021.

(51) Int. Cl.
*H02M 3/158* (2006.01)
*H02M 1/00* (2007.01)
(Continued)

(52) U.S. Cl.
CPC ....... *H02M 3/1582* (2013.01); *H02M 1/0009* (2021.05); *H02M 1/0025* (2021.05);
(Continued)

(58) Field of Classification Search
CPC ........ H02M 3/158; H02M 3/155; H02M 3/07; H02M 1/0095; H02M 3/1582; H02M 3/1588; H02M 1/0009; H02M 1/0025
See application file for complete search history.

(56) References Cited

U.S. PATENT DOCUMENTS 10,075,076 B1 9/2018 Tadeparthy et al.
10,122,265 B1 * 11/2018 Matthew ................. H02M 1/44
(Continued)

OTHER PUBLICATIONS

Search Report under Section 17, UKIPO, Application No. GB2218355.2, mailed Jun. 8, 2023.

*Primary Examiner* — Gustavo A Rosario-Benitez
(74) *Attorney, Agent, or Firm* — Jackson Walker L.L.P.

(57) ABSTRACT

A power converter system for converting an input voltage at an input into an output voltage at an output may comprise a switch network comprising a reactive circuit element and a plurality of switches, switch control circuitry configured to operate the plurality of switch in a plurality of periodic, sequential states to regulate the output voltage, and reference current generating circuitry. The reference current generating circuitry may include a comparator coupled to a sensed switch of the plurality of switches and configured to compare a current flowing through the sensed switch to a reference current and current-steering circuitry coupled to the comparator configured to generate the reference current and alternate the reference current between a first reference current and a second reference current whenever the switch control circuitry changes from one state of the plurality of periodic, sequential states to another state of the plurality of periodic, sequential states.

26 Claims, 5 Drawing Sheets

(51) Int. Cl.
*H02M 3/07* (2006.01)
*H04R 1/00* (2006.01)

(52) U.S. Cl.
CPC .......... *H02M 1/0095* (2021.05); *H02M 3/07* (2013.01); *H04R 1/005* (2013.01)

(56) References Cited

U.S. PATENT DOCUMENTS

| | | | |
|---|---|---|---|
| 2013/0314067 A1* | 11/2013 | Matzberger | H02M 3/1588 |
| | | | 323/311 |
| 2017/0040895 A1* | 2/2017 | May | G01R 19/165 |
| 2017/0141683 A1* | 5/2017 | Vacca Cavalotto | H02M 1/32 |
| 2018/0183316 A1* | 6/2018 | Horsky | H05B 45/375 |
| 2019/0058398 A1* | 2/2019 | Sharifi | H02M 3/06 |
| 2019/0363625 A1* | 11/2019 | Kirchner | H02M 3/158 |
| 2020/0358443 A1 | 11/2020 | Mora et al. | |
| 2021/0152100 A1* | 5/2021 | Zilio | H02M 7/4837 |
| 2021/0234457 A1* | 7/2021 | Silva | H02M 1/32 |
| 2021/0273581 A1* | 9/2021 | Shumkov | H02M 1/0025 |
| 2023/0188156 A1* | 6/2023 | Perry | H04R 1/005 |
| | | | 341/144 |

\* cited by examiner

DELTA-BASED CURRENT STEERING FOR POWER CONVERTER PEAK/VALLEY CURRENT CONTROL

RELATED APPLICATION

The present disclosure claims priority to U.S. Provisional Patent Application Ser. No. 63/289,870 filed Dec. 15, 2021, which is incorporated by reference herein in its entirety.

FIELD OF DISCLOSURE

The present disclosure relates in general to circuits for electronic devices, including without limitation personal audio devices such as wireless telephones and media players, and more specifically, to the methods and systems of delta-based current steering in current-sensing circuitry for use in peak/valley current control of a power converter.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers. Oftentimes, a power converter may be used to provide a supply voltage to a power amplifier in order to amplify a signal driven to speakers, headphones, other transducers, batteries, or other electrical and/or electronic components. A switching power converter is a type of electronic circuit that converts a source of power from one direct current (DC) voltage level to another DC voltage level. Examples of such switching DC-DC converters include but are not limited to a boost converter, a buck converter, a buck/boost converter, an inverting buck/boost converter, and other types of switching DC-DC converters. Thus, using a power converter, a DC voltage such as that provided by a battery may be converted to another DC voltage used to power the power amplifier. A power converter may be used to provide supply voltage rails to one or more components in a device. A power converter may also be used in other applications besides driving audio transducers, such as driving haptic actuators or other electrical or electronic loads. Further, a power converter may also be used in charging a battery from a source of electrical energy (e.g., an AC-to-DC adapter).

One approach to regulating a DC voltage in an inductive-based power converter output is that of peak/valley current control. Using peak/valley current control, control circuitry may employ a feedback control loop that may, as a function of a desired regulated output voltage of the power converter, determine a target minimum or "valley" current and a target maximum or "peak" current through an inductor of the power converter, and control switches of the power converter based on comparison of a sensed current through the inductor in order to regulate the sensed current between the valley current and the peak current. Accordingly, peak/valley current control requires the use of comparators.

However, implementation of a comparator on an integrated circuit may be expensive in terms of both area required for the comparator and power consumed by the comparator. Thus, systems and methods employing techniques that minimize a number of comparators required for peak/valley control may be desired.

SUMMARY

In accordance with the teachings of the present disclosure, one or more disadvantages and problems associated with existing topologies for hybrid 3-level buck/boost converters may be reduced or eliminated.

In accordance with embodiments of the present disclosure, a power converter system for converting an input voltage at an input of the power converter system into an output voltage at an output of the power converter system may comprise a switch network comprising a reactive circuit element and a plurality of switches, switch control circuitry configured to operate the plurality of switches in a plurality of periodic, sequential states to regulate the output voltage, and reference current generating circuitry. The reference current generating circuitry may include a comparator coupled to a sensed switch of the plurality of switches and configured to compare a current flowing through the sensed switch to a reference current and current-steering circuitry coupled to the comparator configured to generate the reference current and alternate the reference current between a first reference current and a second reference current whenever the switch control circuitry changes from one state of the plurality of periodic, sequential states to another state of the plurality of periodic, sequential states.

In accordance with these and other embodiments of the present disclosure, a method may be provided for use in a power converter system for converting an input voltage at an input of the power converter system into an output voltage at an output of the power converter system, wherein the power converter system comprises a switch network comprising a reactive circuit element and a plurality of switches and switch control circuitry configured to operate the plurality of switches in a plurality of periodic, sequential states to regulate the output voltage. The method may include comparing a current flowing through the sensed switch to a reference current with a comparator coupled to a sensed switch of the plurality of switches and generating, with current-steering circuitry coupled to the comparator, the reference current and alternate the reference current between a first reference current and a second reference current whenever the switch control circuitry changes from one state of the plurality of periodic, sequential states to another state of the plurality of periodic, sequential states.

In accordance with these and other embodiments of the present disclosure, a circuit may include a plurality of switches, switch control circuitry configured to operate the plurality of switches in a plurality of different switch states, and reference current generating circuitry comprising a comparator coupled to a sensed switch of the plurality of switches and configured to compare a current flowing through the sensed switch to a reference current and current-steering circuitry coupled to the comparator configured to generate the reference current and alternate the reference current between a first reference current and a second reference current whenever the switch control circuitry changes from one switch state to another switch state.

In accordance with these and other embodiments of the present disclosure, a method may be provided for a circuit comprising a plurality of switches and switch control circuitry configured to operate the plurality of switches in a plurality of different switch states. The method may include comparing a current flowing through the sensed switch to a reference current with a comparator coupled to a sensed switch of the plurality of switches and generating, with current-steering circuitry coupled to the comparator, the reference current and alternating the reference current between a first reference current and a second reference current whenever the switch control circuitry changes from one switch state to another switch state.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
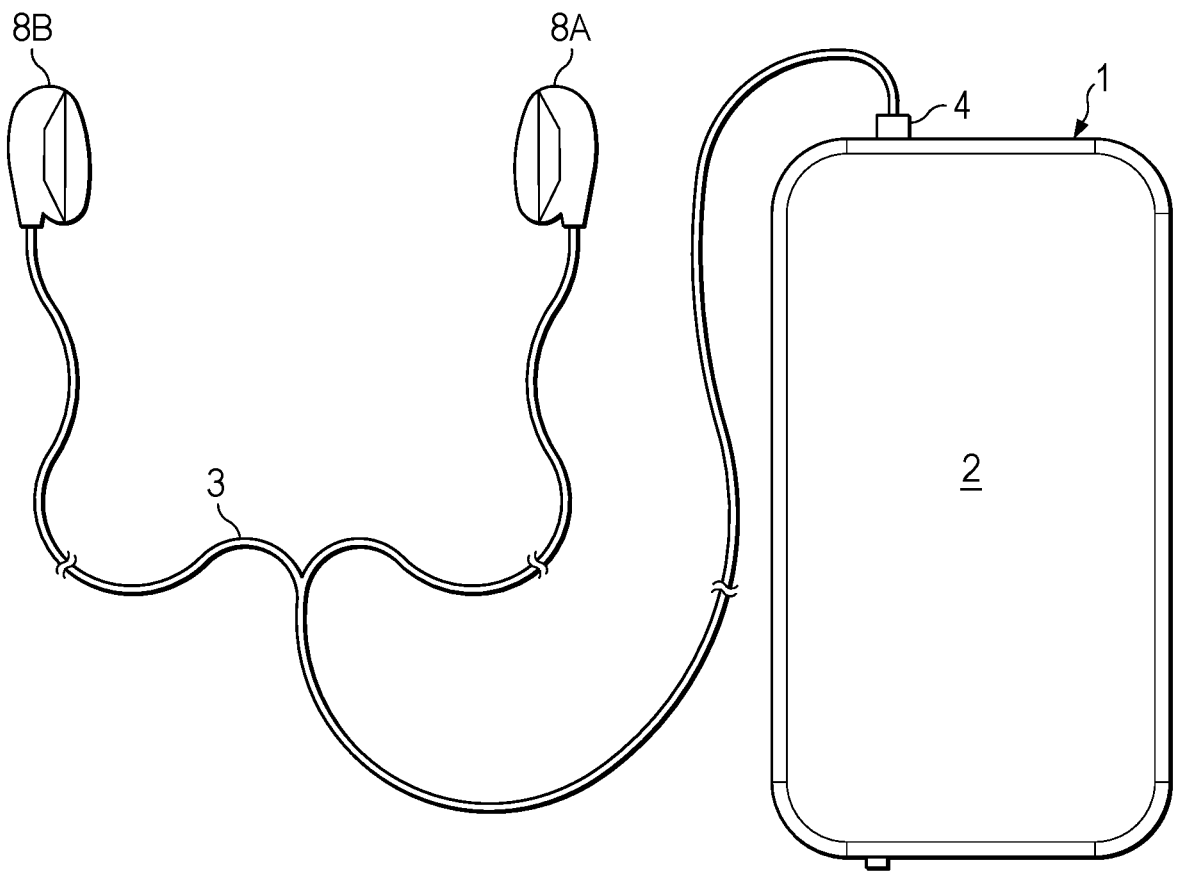
FIG. 1 illustrates an example mobile device, in accordance with embodiments of the present disclosure.

FIG. 1 illustrates an example mobile device 1, in accordance with embodiments of the present disclosure. FIG. 1 depicts mobile device 1 coupled to a headset 3 in the form of a pair of earbud speakers 8A and 8B. Headset 3 depicted in FIG. 1 is merely an example, and it is understood that mobile device 1 may be used in connection with a variety of audio transducers, including without limitation, headphones, earbuds, in-ear earphones, and external speakers. A plug 4 may provide for connection of headset 3 to an electrical terminal of mobile device 1. Mobile device 1 may provide a display to a user and receive user input using a touch screen 2, or alternatively, a standard liquid crystal display (LCD) may be combined with various buttons, sliders, and/or dials disposed on the face and/or sides of mobile device 1.

Figure 2:
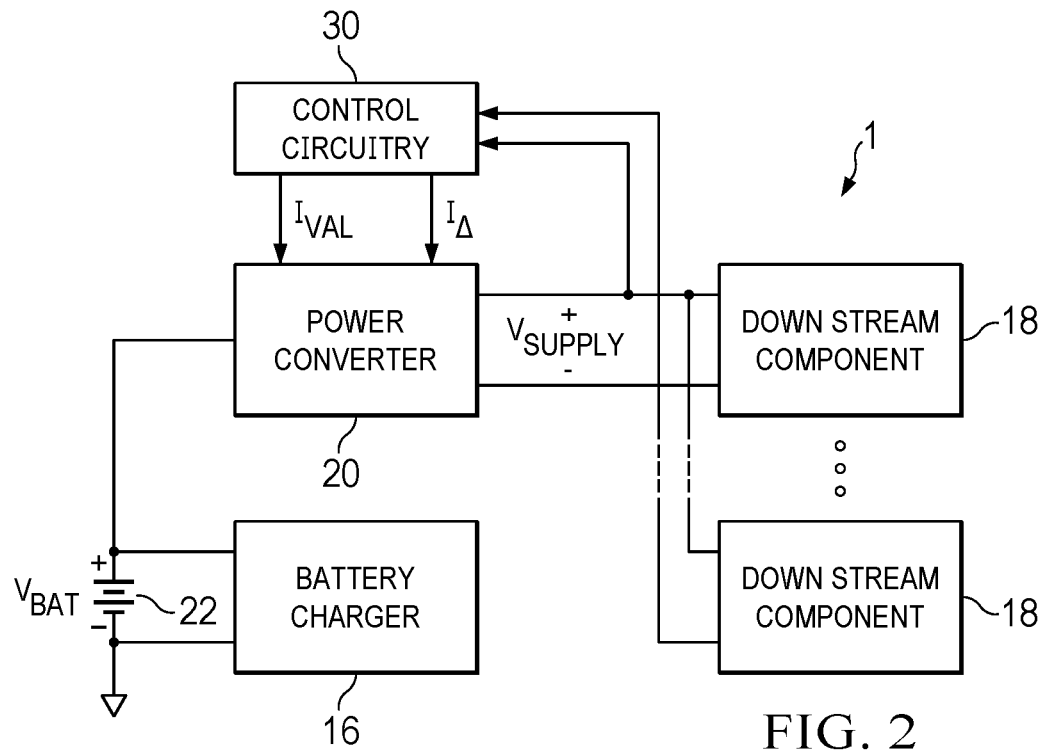
FIG. 2 illustrates a block diagram of selected components internal to a mobile device, in accordance with embodiments of the present disclosure.

FIG. 2 illustrates a block diagram of selected components integral to mobile device 1, in accordance with embodiments of the present disclosure. As shown in FIG. 2, mobile device 1 may include a power converter 20 configured to convert a battery voltage $V_{BAT}$ to generate a supply voltage $V_{SUPPLY}$ to a plurality of downstream components 18 of mobile device 1. Downstream components 18 of mobile device 1 may include any suitable functional circuits or devices of mobile device 1, including without limitation processors, audio coder/decoders, amplifiers, display devices, etc. As shown in FIG. 2, mobile device 1 may also include a battery charger 16 for recharging battery 22.

In some embodiments of mobile device 1, power converter 20 and battery charger 16 may comprise the only components of mobile device 1 electrically coupled to battery 22, and power converter 20 may electrically interface between battery 22 and all downstream components 18 of mobile device 1. However, in other embodiments of mobile device 1, some downstream components 18 may electrically couple directly to battery 22.

As also shown in FIG. 2, mobile device 1 may include control circuitry 30. Control circuitry 30 may comprise any system, device, or apparatus, configured to implement a feedback control loop wherein based on supply voltage $V_{SUPPLY}$ and a desired setpoint voltage level for supply voltage $V_{SUPPLY}$, control circuitry 30 may calculate a valley current $I_{VAL}$ and a ripple current $I_A$ for peak/valley control of power converter 20, such that a current flowing through a power inductor of power converter 20 is regulated between valley current $I_{VAL}$ and a peak current $I_{PK}=I_{VAL}+I_A$ via control of switches of power converter 20. Approaches for calculating valley current $I_{VAL}$ and peak current $I_{PK}$ based on a measured output voltage (e.g., supply voltage $V_{SUPPLY}$) and a desired setpoint voltage level for the measured output voltage are well-known in the art and thus, beyond the scope of this disclosure.

Figure 3A:
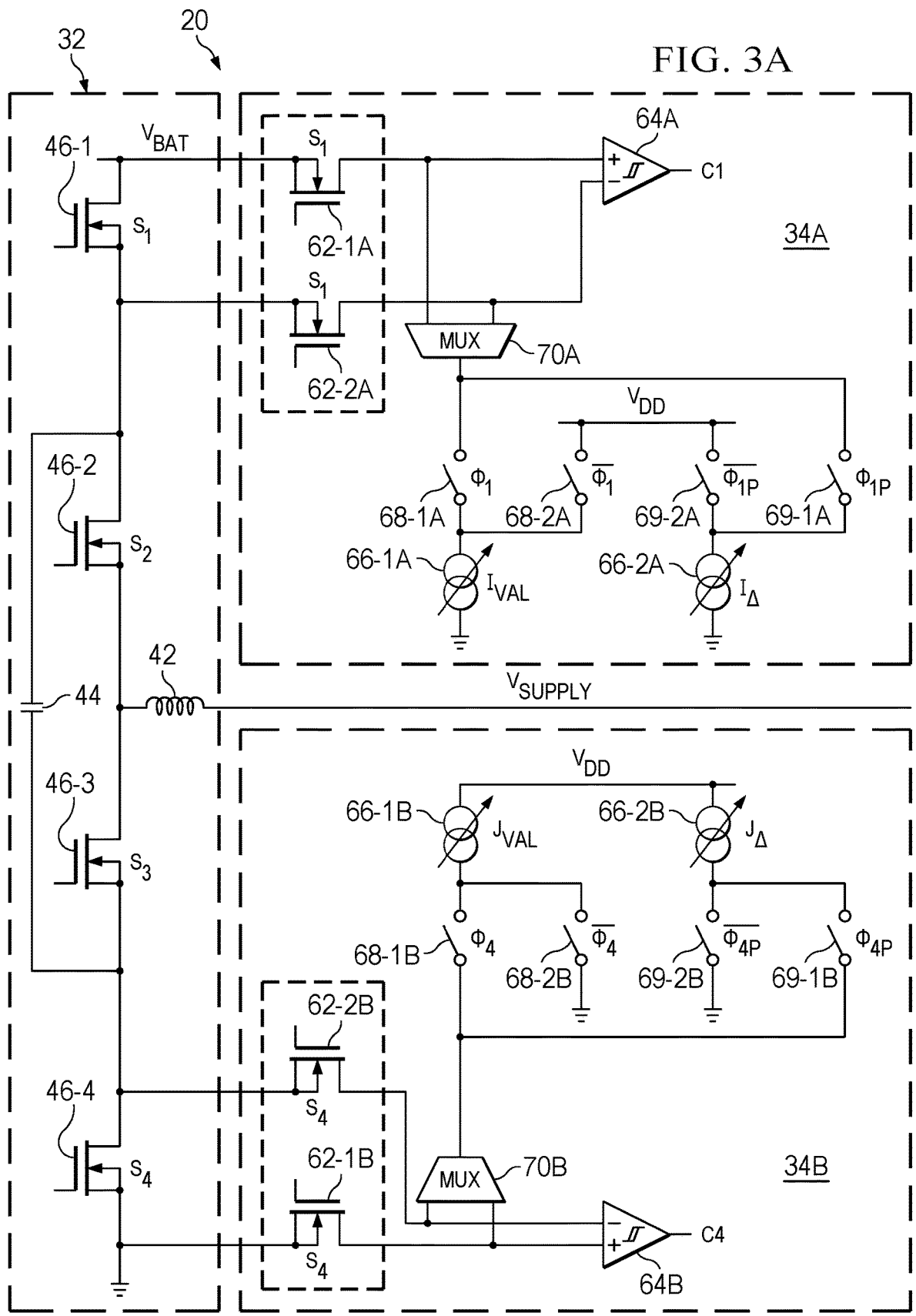
FIGS. 3A and 3B (which may be referred to herein collectively as "FIG. 3") illustrate a circuit diagram of an example power converter implemented as a 3-level hybrid buck/boost converter, in accordance with embodiments of the present disclosure.
Figure 3B:
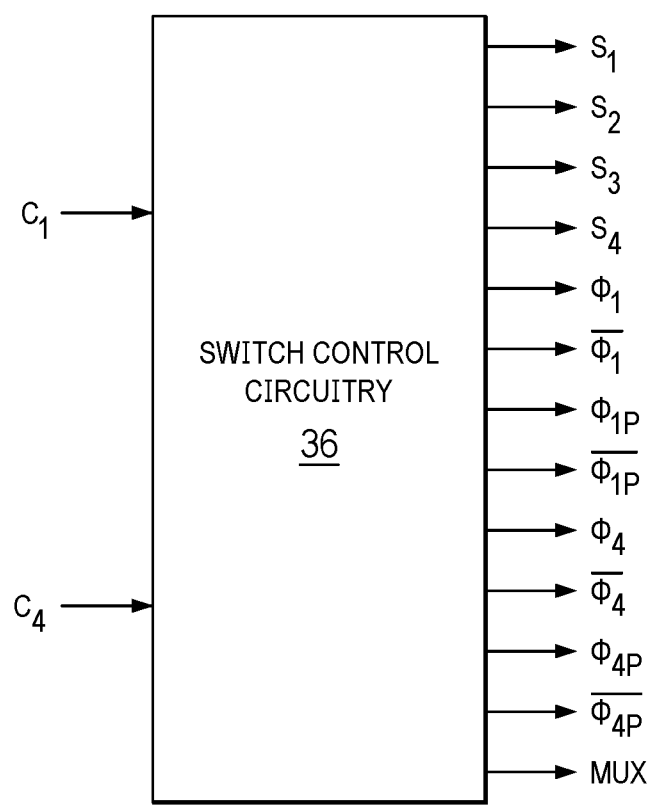

FIG. 3 illustrates a circuit diagram of an example power converter 20 implemented as a 3-level hybrid buck/boost converter, in accordance with embodiments of the present disclosure. As shown in FIG. 3, power converter 20 may include an inductive switching network 32, current sensing circuits 34A and 34B, and switch control circuitry 36.

Inductive switching network 32 may include a power inductor 42, a flying capacitor 44 having a first capacitor terminal and a second capacitor terminal, and a plurality of switches 46-1, 46-2, 46-3, and 46-4, wherein switch 46-1 is coupled between an input of power converter 20 (e.g., to receive battery voltage $V_{BAT}$) and the first capacitor terminal, switch 46-2 is coupled between the first capacitor terminal and the switching node, switch 46-3 is coupled between the second capacitor terminal and the switching node, and switch 46-4 is coupled between the second capacitor terminal and a ground voltage. Switches 46 may be implemented using any suitable switching device, including without limitation N-type field effect transistors as shown in FIG. 3.

Figure 4A:
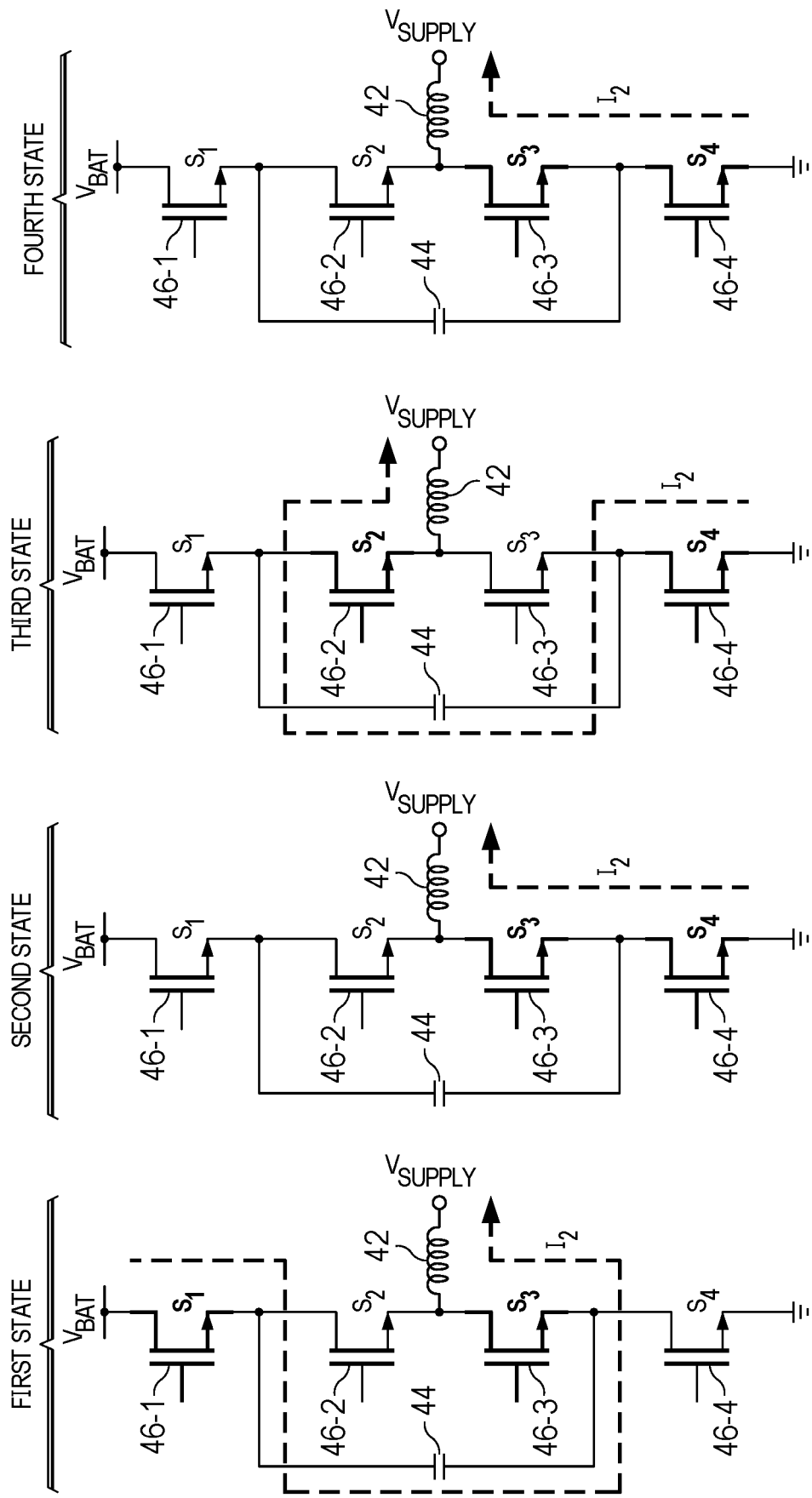
FIGS. 4A and 4B illustrate buck operation of the power converter depicted in FIG. 3, in accordance with embodiments of the present disclosure.
Figure 4B:
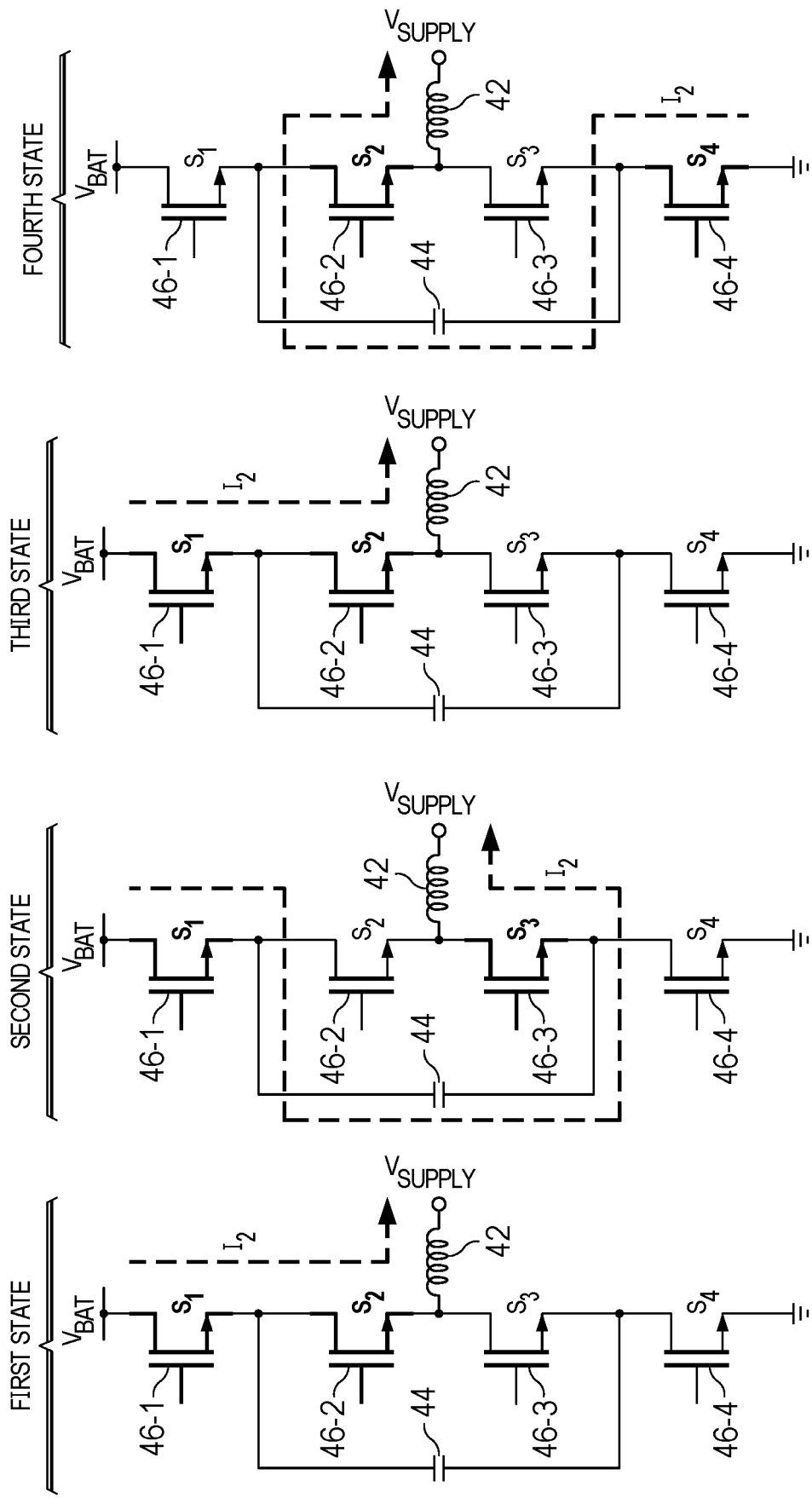

In operation, switch control circuitry 36 may control switches 46 to regulate supply voltage $V_{SUPPLY}$ to a desired target voltage. Turning briefly to FIGS. 4A and 4B, buck operation of a power converter 20 may include cyclic, periodic commutation of switches 46 among a plurality of switch states. FIG. 4A depicts example buck operation for $V_{SUPPLY}<V_{BAT}/2$, while FIG. 4B depicts example buck operation for $V_{SUPPLY}>V_{BAT}/2$.

As shown in FIG. 4A, for $V_{SUPPLY}<V_{BAT}/2$, switches 46-1 and 46-3 may be activated (and switches 46-2 and 46-4 deactivated) during a first state, inductively charging power inductor 42 until such time as inductor current $I_L$ exceeds peak current $I_{PK}$, at which point control circuitry 36 may control switches 46 to enter a second state. In the second state, switches 46-3 and 46-4 may be activated (and switches 46-1 and 46-2 may be deactivated), inductively discharging power inductor 42 until such time as inductor current $I_L$ falls below valley current $I_{VAL}$, at which point control circuitry 36 may control switches 46 to enter a third state. In the third state, 46-2 and 46-4 may be activated (and switches 46-1 and 46-3 may be deactivated), inductively charging power inductor 42 until such time as inductor current $I_L$ exceeds peak current $I_{PK}$, at which point control circuitry 36 may control switches 46 to enter a fourth state. In the fourth state, switches 46-3 and 46-4 may be activated (and switches 46-1 and 46-2 may be deactivated), inductively discharging power inductor 42 until such time as inductor current $I_L$ falls below valley current $I_{VAL}$, at which point control circuitry 36 may control switches 46 to again enter the first state.

Further, as shown in FIG. 4B, for $V_{SUPPLY} > V_{BAT}/2$, switches 46-1 and 46-2 may be activated (and switches 46-3 and 46-4 deactivated) during a first state, inductively charging power inductor 42 until such time as inductor current $I_L$ exceeds peak current $I_{PK}$, at which point control circuitry 36 may control switches 46 to enter a second state. In the second state, switches 46-1 and 46-3 may be activated (and switches 46-2 and 46-4 may be deactivated), inductively discharging power inductor 42 until such time as inductor current $I_L$ falls below valley current $I_{VAL}$, at which point control circuitry 36 may control switches 46 to enter a third state. In the third state, 46-1 and 46-2 may be activated (and switches 46-3 and 46-4 may be deactivated), inductively charging power inductor 42 until such time as inductor current $I_L$ exceeds peak current $I_{PK}$, at which point control circuitry 36 may control switches 46 to enter a fourth state. In the fourth state, switches 46-2 and 46-4 may be activated (and switches 46-1 and 46-3 may be deactivated) inductively discharging power inductor 42 until such time as inductor current $I_L$ falls below valley current $I_{VAL}$, at which point control circuitry 36 may control switches 46 to again enter the first state.

One of ordinary skill in the art will recognize that boost operation of power converter 20 may be similar to the buck operation as shown in FIGS. 4A and 4B, with differing orders of switch states and opposite direction of flow for inductor current $I_L$.

From FIGS. 4A and 4B, it is evident that inductor current flows through either of switch 46-1 or switch 46-4 in each switching state. Further, although not shown in FIGS. 4A and 4B, inductor current flows through either of switch 46-1 or switch 46-4 in each switching state during boost operation as well. Accordingly, inductor current $I_L$ may be sensed by sensing current through switch 46-1 or switch 46-4 depending on mode of operation (e.g., buck operation or boost operation) and switching state. For example, for buck operation when $V_{SUPPLY} < V_{BAT}/2$, sensing current through switch 46-1 may be used for peak detection during the first state and sensing current through switch 46-4 may be used for valley detection during the second state and the fourth state and for peak detection during the third state. As another example, for buck operation when $V_{SUPPLY} > V_{BAT}/2$, sensing current through switch 46-1 may be used for peak detection during the first state and the third state and for valley detection during the second state, while switch 46-4 may be used for valley detection during the fourth state.

Accordingly, turning again to FIG. 3, power converter 20 may include sensing circuitry 34A for sensing current flow through switch 46-1 and sensing circuitry 34B for sensing current flow through switch 46-4. As shown in FIG. 3, sensing circuitry 34A may include sensing switches 62-1A and 62-2A and a comparator 64A such that sensing switch 62-1A is coupled between an input (e.g., battery voltage $V_{BAT}$) of power converter 20 and a positive input terminal of comparator 64A and sensing switch 62-2A is coupled between the first terminal of flying capacitor 44 and a negative input terminal of comparator 64A (although in some embodiments, such polarity connectivity may be reversed). Each of sensing switches 62-1A and 62-2A may receive the same control signal S1 used to control switch 46-1, but switch 46-1 may have a significantly lower (e.g., by a factor of 10,000 or more) impedance when activated (e.g., turned on, closed, enabled) as compared to the impedance when activated of either of sensing switches 62-1A and 62-2A. Further, sensing circuitry 34A may also include current steering circuitry (implemented in FIG. 3 as a current digital-to-analog converter) including a variable current source 66-1A configured to generate valley current $I_{VAL}$ based on one or more control signals from control circuitry 30 and a variable current source 66-2A configured to generate ripple current $I_\Delta$ based on one or more control signals from control circuitry 30. In addition, such current steering circuitry may include current-steering switches 68-1A, 68-2A, 69-1A, and 69-2A respectively controlled by control signals $\Phi_1$, $\overline{\Phi_1}$, $\Phi_{1P}$, and $\overline{\Phi_{1P}}$ generated by switch control circuitry 36. Accordingly, when current steering switches 68-1A and 69-2A are enabled (and current steering switches 68-2A and 69-1A are disabled), valley current $I_{VAL}$ may be driven to the input of multiplexer 70A for valley detection of inductor current $I_L$ sensed through switch 46-1 and when current steering switches 68-1A and 69-1A are enabled (and current steering switches 68-2A and 69-2A are disabled), peak current $I_{PK} = I_{VAL} + I_\Delta$ may be driven to the input of multiplexer 70A for peak detection of inductor current $I_L$ sensed through switch 46-1. In some embodiments, the switch control circuitry 30 may control current steering circuitry to enter a high-impedance mode in which current steering switches 68-2A and 69-2A are enabled (and current steering switches 68-1A and 69-1A are disabled), such that current steering circuitry drives zero current into the input of multiplexer 70A. In addition, switch control circuitry 36 may control multiplexer 70A via a control signal MUX, such that in a buck mode of operation, the current driven to the input of multiplexer 70A may pass through multiplexer 70A to be driven onto the electrical node coupled between sensing switch 62-1A and the positive input of comparator 64A and in a boost mode of operation, the current driven to the input of multiplexer 70A may pass through multiplexer 70A to be driven onto the electrical node coupled between sensing switch 62-2A and the negative input of comparator 64A. As a result, comparator 64A may compare inductor current $I_L$ sensed through switch 46-1 to the current generated by the current-steering circuitry and generate a comparison result C1 based on the comparison to indicate, as appropriate, whether inductor current $I_L$ is below valley current $I_{VAL}$ or above peak current $I_{PK}$.

Sensing circuitry 34B may operate in a similar manner. As shown in FIG. 3, sensing circuitry 34B may include sensing switches 62-1B and 62-2B and a comparator 64B such that sensing switch 62-1B is coupled between a ground voltage and a positive input terminal of comparator 64B and sensing switch 62-2B is coupled between the second terminal of flying capacitor 44 and a negative input terminal of comparator 64B. Each of sensing switches 62-1B and 62-2B may receive the same control signal S4 used to control switch 46-4, but switch 46-4 may have a significantly lower (e.g., by a factor of 10,000 or more) impedance when activated (e.g., turned on, closed, enabled) as compared to the impedance when activated of either of sensing switches 62-1B and 62-2B. Further, sensing circuitry 34B may also include current steering circuitry (implemented in FIG. 3 as a current digital-to-analog converter) including a variable current source 66-1B configured to generate valley current $I_{VAL}$ based on one or more control signals from control circuitry 30 and a variable current source 66-2B configured to generate ripple current $I_\Delta$ based on one or more control signals from control circuitry 30. In addition, such current steering circuitry may include current-steering switches 68-1B, 68-2B, 69-1B, and 69-2B respectively controlled by control signals $\phi_4$, $\overline{\phi_4}$, $\phi_{4P}$, and $\overline{\phi_{4P}}$ generated by switch control circuitry 36. Accordingly, when current steering switches 68-1B and 69-2B are enabled (and current steering switches 68-2B and 69-1B are disabled), valley current $I_{VAL}$ may be driven to the input of multiplexer 70B for valley detection of inductor current $I_L$ sensed through switch 46-4 and when current steering switches 68-1B and 69-1B are enabled (and current steering switches 68-2B and 69-2B are disabled), peak current $I_{PK}=I_{VAL}+I_\Delta$ may be driven to the input of multiplexer 70B for peak detection of inductor current $I_L$ sensed through switch 46-4. In some embodiments, the switch control circuitry 30 may control current steering circuitry to enter a high-impedance mode in which current steering switches 68-2B and 69-2B are enabled (and current steering switches 68-1B and 69-1B are disabled), such that current steering circuitry drives zero current into the input of multiplexer 70B. In addition, switch control circuitry 36 may control multiplexer 70B via control signal MUX, such that in a buck mode of operation, the current driven to the input of multiplexer 70B may pass through multiplexer 70B to be driven onto the electrical node coupled between sensing switch 62-2B and the negative input of comparator 64A and in a boost mode of operation, the current driven to the input of multiplexer 70B may pass through multiplexer 70B to be driven onto the electrical node coupled between sensing switch 62-1B and the positive input of comparator 64B. As a result, comparator 64B may compare inductor current $I_L$ sensed through switch 46-4 to the current generated by the current-steering circuitry and generate a comparison result C4 based on the comparison to indicate, as appropriate, whether inductor current $I_L$ is below valley current $I_{VAL}$ or above peak current $I_{PK}$.

Although the systems and methods are described above with reference to an inductive-based power converter, it is understood that the systems and methods described above, or systems and methods similar thereto, may be applied to other types of power converters, including switched capacitor power converters, hybrid power converters (e.g., including inductive and capacitive elements), charge pumps, or any other suitable type of power converter.

Further, although the systems and methods are described above with reference to power conversion from a battery to downstream components of a device, it is understood that the systems and methods described above may be applied generally to power converters, despite the function of such power converters. For example, in some embodiments, a power converter in accordance with embodiments of the present disclosure may be integral to a battery charger and thus may convert a voltage from a source of electrical energy into a voltage for charging a battery with such battery charger.

In addition, the systems and methods described herein may generally be applied to any switch network having a plurality of different switch states, whether or not used as part of a power converter. Thus, a circuit may include a plurality of switches and switch control circuitry may be configured to operate the plurality of switches in a plurality of different switch states. Such a circuit may also include reference current generating circuitry having a comparator coupled to a sensed switch of the plurality of switches and configured to compare a current flowing through the sensed switch to a reference current and current-steering circuitry coupled to the comparator configured to generate the reference current and alternate the reference current between a first reference current and a second reference current whenever the switch control circuitry changes from one switch state to another switch state.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A power converter system for converting an input voltage at an input of the power converter system into an output voltage at an output of the power converter system, the power converter system comprising:
   a switch network comprising a reactive circuit element and a plurality of switches;
   switch control circuitry configured to operate the plurality of switches in a plurality of periodic, sequential states to regulate the output voltage; and
   reference current generating circuitry comprising:
      a comparator coupled to a sensed switch of the plurality of switches and configured to compare a current flowing through the sensed switch to a reference current; and
      current-steering circuitry coupled to the comparator configured to generate the reference current and alternate the reference current between a first reference current and a second reference current whenever the switch control circuitry changes from one state of the plurality of periodic, sequential states to another state of the plurality of periodic, sequential states.

2. The power converter system of claim 1, wherein:
   the first reference current defines a minimum target current for the current; and
   the second reference current defines a maximum target current for the current.

3. The power converter system of claim 1, further comprising:
   a first sensing switch coupled between a first terminal of the sensed switch and a first terminal of the comparator, wherein the first sensing switch is controlled by a control signal that also controls the sensed switch; and
   a second sensing switch coupled between a second terminal of the sensed switch and a second terminal of the comparator, wherein the second sensing switch is controlled by the control signal.

4. The power converter system of claim 1, wherein:
   the reactive circuit element comprises a power inductor; and
   the current flows through the power inductor.

5. The power converter system of claim 1, wherein the switch network comprises a multi-level power converter.

6. The power converter system of claim 5, wherein the switch network comprises:
   a switching node, wherein the power inductor is coupled between the switching node and the output;
   a flying capacitor having a first flying capacitor terminal and a second flying capacitor terminal;
   a first switch coupled between the input and the first flying capacitor terminal;
   a second switch coupled between the first flying capacitor terminal and the switching node;
   a third switch coupled between the second flying capacitor terminal and the switching node; and
   a fourth switch coupled between the second flying capacitor terminal and a ground voltage.

7. The power converter system of claim 6, wherein the sensed switch comprises the first switch.

8. The power converter system of claim 6, wherein the sensed switch comprises the fourth switch.

9. The power converter system of claim 1, wherein the current-steering circuitry is implemented with a current digital-to-analog converter.

10. The power converter system of claim 1, wherein the current-steering circuitry comprises:
    a first current source configured to generate the first reference current;
    a second current source configured to generate a ripple reference current equal to a difference between the second reference current and the first reference current; and
    a network of current-steering switches configured to:
       in at least a first state of the plurality of periodic, sequential states, steer the first reference current generated by the first current source to an electrical node coupled to an input terminal of the comparator; and
       in at least a second state of the plurality of periodic, sequential states, steer the first reference current generated by the first current source and the ripple reference current generated by the second current source to the electrical node.

11. The power converter system of claim 1, wherein the reactive circuit element comprises a power inductor.

12. The power converter system of claim 1, wherein the reactive circuit element comprises a capacitor.

13. A method, in a power converter system for converting an input voltage at an input of the power converter system into an output voltage at an output of the power converter system, wherein the power converter system comprises a switch network comprising a reactive circuit element and a plurality of switches and switch control circuitry configured to operate the plurality of switches in a plurality of periodic, sequential states to regulate the output voltage, the method comprising:
    comparing a current flowing through a sensed switch to a reference current with a comparator coupled to the sensed switch of the plurality of switches; and
    generating, with current-steering circuitry coupled to the comparator, the reference current and alternating the reference current between a first reference current and a second reference current whenever the switch control circuitry changes from one state of the plurality of periodic, sequential states to another state of the plurality of periodic, sequential states.

14. The method of claim 13, wherein:
    the first reference current defines a minimum target current for the current; and
    the second reference current defines a maximum target current for the current.

15. The method of claim 13, wherein:
    the power converter system further comprises a first sensing switch coupled between a first terminal of the sensed switch and a first terminal of the comparator and a second sensing switch coupled between a second terminal of the sensed switch and a second terminal of the comparator; and
    the method further comprising controlling the first sensing switch by a control signal that also controls the sensed switch and controlling the second sensing switch with the control signal.

16. The method of claim 13, wherein:
    the reactive circuit element comprises a power inductor; and
    the current flows through the power inductor.

17. The method of claim 13, wherein the switch network comprises a multi-level power converter.

18. The method of claim 17, wherein the switch network comprises:
    a switching node, wherein the power inductor is coupled between the switching node and the output;

a flying capacitor having a first flying capacitor terminal and a second flying capacitor terminal;

a first switch coupled between the input and the first flying capacitor terminal;

a second switch coupled between the first flying capacitor terminal and the switching node;

a third switch coupled between the second flying capacitor terminal and the switching node; and a fourth switch coupled between the second flying capacitor terminal and a ground voltage.

19. The method of claim 18, wherein the sensed switch comprises the first switch.

20. The method of claim 18, wherein the sensed switch comprises the fourth switch.

21. The method of claim 13, wherein the current-steering circuitry is implemented with a current digital-to-analog converter.

22. The method of claim 13, wherein the current-steering circuitry comprises:
- a first current source configured to generate the first reference current;
- a second current source configured to generate a ripple reference current equal to a difference between the second reference current and the first reference current; and
- a network of current-steering switches configured to:
  - in at least a first state of the plurality of periodic, sequential states, steer the first reference current generated by the first current source to an electrical node coupled to an input terminal of the comparator; and
  - in at least a second state of the plurality of periodic, sequential states, steer the first reference current generated by the first current source and the ripple reference current generated by the second current source to the electrical node.

23. The method of claim 13, wherein the reactive circuit element comprises a power inductor.

24. The method of claim 13, wherein the reactive circuit element comprises a capacitor.

25. A circuit comprising:
a plurality of switches;
switch control circuitry configured to operate the plurality of switches in a plurality of different switch states; and
reference current generating circuitry comprising:
- a comparator coupled to a sensed switch of the plurality of switches and configured to compare a current flowing through the sensed switch to a reference current; and
- current-steering circuitry coupled to the comparator configured to generate the reference current and alternate the reference current between a first reference current and a second reference current whenever the switch control circuitry changes from one switch state to another switch state.

26. A method, for a circuit comprising a plurality of switches and switch control circuitry configured to operate the plurality of switches in a plurality of different switch states, the method comprising:
comparing a current flowing through a sensed switch to a reference current with a comparator coupled to the sensed switch of the plurality of switches; and
generating, with current-steering circuitry coupled to the comparator, the reference current and alternating the reference current between a first reference current and a second reference current whenever the switch control circuitry changes from one switch state to another switch state.

* * * * *